United States Patent
Loewenhardt et al.

(10) Patent No.: US 6,402,885 B2
(45) Date of Patent: *Jun. 11, 2002

(54) MAGNETICALLY ENHANCED INDUCTIVELY COUPLED PLASMA REACTOR WITH MAGNETICALLY CONFINED PLASMA

(75) Inventors: Peter K. Loewenhardt, Pleasanton; Gerald Z. Yin; Philip M. Salzman, both of San Jose, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/773,409

(22) Filed: Jan. 31, 2001

Related U.S. Application Data

(63) Continuation of application No. 09/521,799, filed on Mar. 9, 2000, which is a continuation of application No. 09/263,001, filed on Mar. 5, 1999, which is a continuation-in-part of application No. 08/766,119, filed on Dec. 16, 1996, now Pat. No. 6,030,486, which is a continuation of application No. 08/590,998, filed on Jan. 24, 1996, now abandoned.

(51) Int. Cl.[7] ............................. H01L 21/00; H05H 1/00
(52) U.S. Cl. .................. 156/345; 118/723 R; 118/723 I
(58) Field of Search ...................... 156/345; 118/723 R, 118/723 E, 723 I; 204/298.37

(56) References Cited

U.S. PATENT DOCUMENTS

| | | | |
|---|---|---|---|
| 4,438,723 A | 3/1984 | Cannella et al. | |
| 4,440,107 A | 4/1984 | Doehler et al. | |
| 4,483,737 A | 11/1984 | Mantei | |
| 4,810,935 A | 3/1989 | Boswell | |
| 4,842,707 A | 6/1989 | Kinoshita | |
| 4,990,229 A | 2/1991 | Campbell et al. | |
| 4,993,361 A | 2/1991 | Unvala | |
| 5,091,049 A | 2/1992 | Campbell et al. | |
| 5,122,251 A | 6/1992 | Campbell et al. | |
| 5,160,398 A | 11/1992 | Yanagida | |
| 5,178,739 A | 1/1993 | Barnes et al. | |

(List continued on next page.)

FOREIGN PATENT DOCUMENTS

| | | |
|---|---|---|
| EP | 0 173 583 | 3/1986 |
| EP | 0 651 425 | 5/1995 |
| EP | 0 786 794 | 7/1997 |
| JP | 7-22389 | 1/1995 |
| JP | 8-264515 | 10/1996 |

OTHER PUBLICATIONS

Quick, A.K., Chen, R.T.S., and Hershkowitz, N., "Etch rate and plasma density radial uniformity measurements in a cusped field helicon plasma etcher," *J. Vac. Sci. Technol.*, vol. 14, No. 3, May/Jun. 1996, pp. 1041–1045.

*Primary Examiner*—Thi Dang
(74) *Attorney, Agent, or Firm*—Michaelson and Wallace; Joseph Bach

(57) ABSTRACT

The invention is embodied in a plasma reactor including a chamber enclosure having a process gas inlet and including a ceiling, a sidewall and a workpiece support pedestal capable of supporting a workpiece at a plasma processing location facing the ceiling, the workpiece processing location and ceiling defining a process region therebetween, the pedestal being spaced from said sidewall to define a pumping annulus therebetween having inner and outer walls, to permit process gas to be evacuated therethrough from the process region. The invention further includes a pair of opposing plasma confinement magnetic poles arranged adjacent the annulus within one of the inner and outer walls of the annulus, the opposing magnetic poles being axially displaced from one another the opposite poles being oriented to provide maximum magnetic flux in a direction across the annulus and a magnetic flux at the processing location less than the magnetic flux across the annulus.

14 Claims, 4 Drawing Sheets

U.S. PATENT DOCUMENTS

| | | |
|---|---|---|
| 5,224,441 A | 7/1993 | Felts et al. |
| 5,346,579 A | 9/1994 | Cook et al. |
| 5,401,351 A | 3/1995 | Samukawa |
| 5,421,891 A | 6/1995 | Campbell et al. |
| 5,429,070 A | 7/1995 | Campbell et al. |
| 5,484,485 A | 1/1996 | Chapman |
| 5,556,501 A | 9/1996 | Collins et al. |
| 5,662,819 A | 9/1997 | Kadomura |
| 6,030,486 A | 2/2000 | Loewenhardt et al. ...... 156/345 |
| 6,189,484 B1 | 2/2000 | Yin et al. .................... 118/723 |
| 6,054,013 A | 4/2000 | Collins et al. .............. 156/345 |
| 6,074,518 A | 6/2000 | Imafuku et al. ............ 156/345 |

MAGNETICALLY ENHANCED INDUCTIVELY COUPLED PLASMA REACTOR WITH MAGNETICALLY CONFINED PLASMA

CROSS REFERENCE

This is a continuation of U.S. application Ser. No. 09/521,799, filed Mar. 9, 2000, which is a continuation of U.S. application Ser. No. 09/263,001, filed Mar. 5, 1999, which is a continuation-in-part of U.S. application Ser. No. 08/766,119, filed Dec. 16, 1996, now U.S. Pat. No. 6,036,426 which is a continuation of now-abandoned U.S. application Ser. No. 08/590,998, filed Jan. 24, 1996.

BACKGROUND OF THE INVENTION

1. Technical Field

The invention is related to plasma reactors for processing semiconductor wafers, and in particular confinement of the processing plasma in the reactor within a limited processing zone.

2. Background Art

Plasma reactors, particularly radio frequency (RF) plasma reactors of the type employed in semiconductor wafer plasma processing in the manufacturing of microelectronic integrated circuits, confine a plasma over a semiconductor wafer in the processing chamber by walls defining a processing chamber. Such an approach for plasma confinement has several inherent problems where employed in plasma reactors for processing semiconductor wafers.

First, the walls confining the plasma are subject to attack from ions in the plasma, typically, for example, by ion bombardment. Such attack can consume the material in the walls or introduce incompatible material from the chamber walls into the plasma process carried out on the wafer, thereby contaminating the process. Such incompatible material may be either the material of the chamber wall itself or may be material (e.g., polymer) previously deposited on the chamber walls during plasma processing, which can flake off or be sputtered off. As one example, if the chamber walls are aluminum and the plasma process to be performed is plasma etching of silicon dioxide, then the material of the chamber wall itself, if sputtered into the plasma, is incompatible with the process and can destroy the integrity of the process.

Second, it is necessary to provide certain openings in the chamber walls and, unfortunately, plasma tends to leak or flow from the chamber through these openings. Such leakage can reduce plasma density near the openings, thereby upsetting the plasma process carried out on the wafer. Also, such leakage can permit the plasma to attack surfaces outside of the chamber interior. As one example of an opening through which plasma can leak from the chamber, a wafer slit valve is conventionally provided in the chamber side wall for inserting the wafer into the chamber and withdrawing the wafer from the chamber. The slit valve must be unobstructed to permit efficient wafer ingress and egress. As another example, a pumping annulus is typically provided, the pumping annulus being an annular volume below the wafer pedestal coupled to a vacuum pump for maintaining a desired chamber pressure. The chamber is coupled to the pumping annulus through a gap between the wafer pedestal periphery and the chamber side wall. The flow of plasma into the pumping annulus permits the plasma to attack the interior surfaces or walls of the pumping annulus. This flow must be unobstructed in order for the vacuum pump to efficiently control the chamber pressure, and therefore the pedestal-to-side wall gap must be free of obstructions.

It is an object of the invention to confine the plasma within the chamber without relying entirely on the chamber walls and in fact to confine the plasma in areas where the chamber walls to not confine the plasma. It is a related object of the invention to prevent plasma from leaking or flowing through openings necessarily provided the chamber walls. It is an auxiliary object to so prevent such plasma leakage without perturbing the plasma processing of the semiconductor wafer.

It is a general object of the invention to shield selected surfaces of the reactor chamber interior from the plasma.

It is a specific object of one embodiment of the invention to shield the interior surface of the reactor pumping annulus from the plasma by preventing plasma from flowing through the gap between the wafer pedestal and the chamber side wall without obstructing free flow of charge-neutral gas through the gap.

It is a specific object of another embodiment of the invention to prevent plasma from flowing through the wafer slit valve in the chamber side wall without obstructing the ingress and egress of the wafer through the wafer slit valve.

SUMMARY OF THE DISCLOSURE

The invention is embodied in a plasma reactor including a chamber enclosure having a process gas inlet and including a ceiling, a sidewall and a workpiece support pedestal capable of supporting a workpiece at a plasma processing location facing the ceiling, the workpiece processing location and ceiling defining a process region therebetween, the pedestal being spaced from said sidewall to define a pumping annulus therebetween having inner and outer walls, to permit process gas to be evacuated therethrough from the process region. The invention further includes a pair of opposing plasma confinement magnetic poles arranged adjacent the annulus within one of the inner and outer walls of the annulus, the opposing magnetic poles being axially displaced from one another the opposite poles being oriented to provide maximum magnetic flux in a direction across the annulus and a magnetic flux at the processing location less than the magnetic flux across the annulus.

DETAILED DESCRIPTION OF THE PREFERRED EMBODIMENTS

Conventional Reactor Elements

Figure 1:
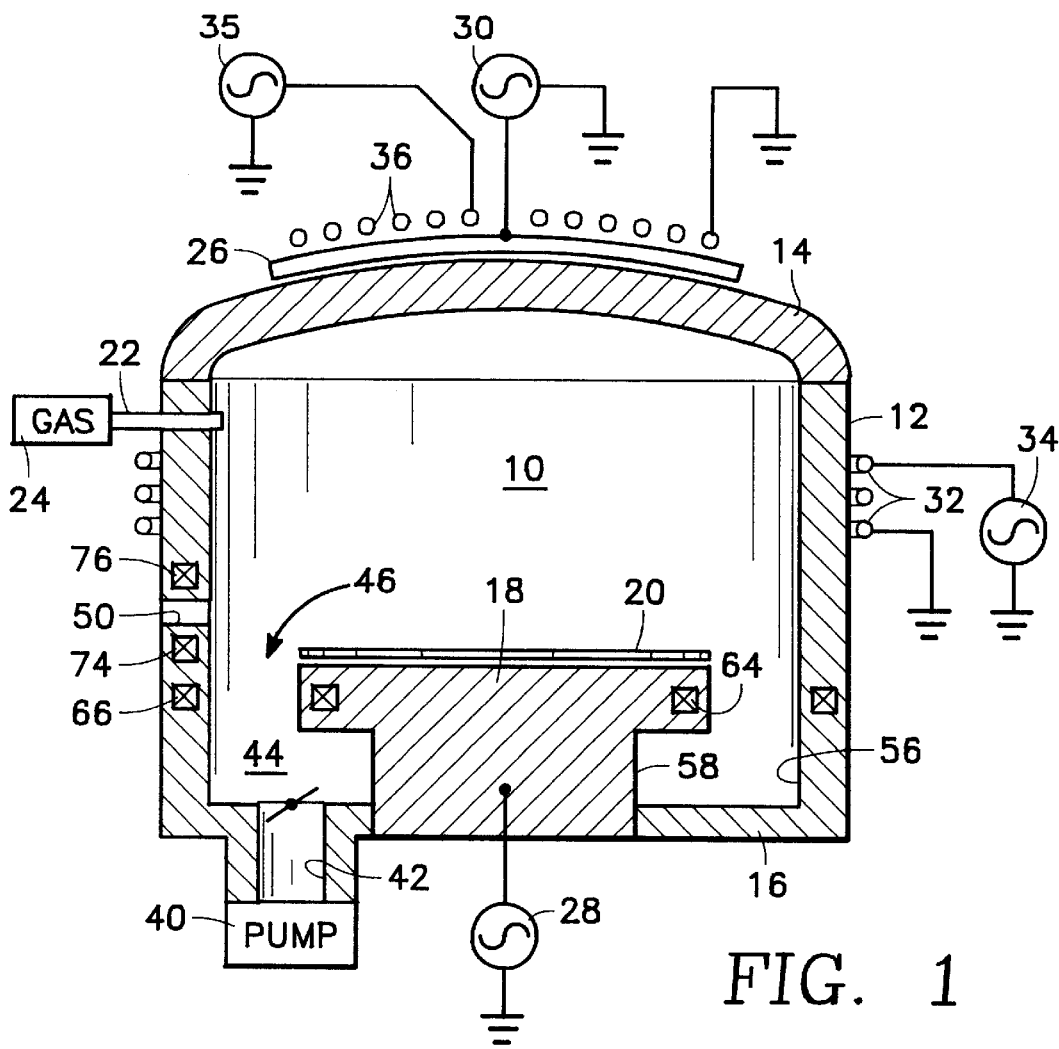
FIG. 1 is a cut-away side view of a plasma reactor in accordance with a first embodiment of the invention employing open magnetic circuits.

Referring to FIG. 1, an RF plasma reactor for processing a semiconductor wafer has a vacuum chamber 10 enclosed by a cylindrical side wall 12, a ceiling 14 and a floor 16. A wafer pedestal 18 supports a semiconductor wafer 20 which is to be processed. A plasma precursor gas is injected into the chamber 10 through a gas injector 22 from a gas supply 24. Plasma source power is coupled into the chamber 10 in any one of several ways. For example, the reactor may be a "diode" configuration, in which case RF power is applied across a ceiling electrode 26 and the wafer pedestal 18. This is accomplished by connecting the pedestal 18 and the ceiling electrode 26 to either one of two RF power sources 28, 30. Alternatively, a cylindrical side coil 32 wound around the chamber side wall 12 is connected to an RF power source 34. Alternatively to the foregoing, or in addition thereto, a top coil 36 is connected to an RF power supply. As is conventional, the wafer pedestal 18 may have its own independently controllable RF power supply 28 so that ion bombardment energy at the wafer surface can be controlled independently of plasma density, determined by the RF power applied to the coil 32 or the coil 36.

A vacuum pump 40 is coupled to the chamber 10 through a passage 42 in the floor 16. The annular space between the periphery of the wafer pedestal 18 and the floor 16 forms a pumping annulus 44 through which the vacuum pump 40 evacuates gas from the chamber 10 to maintain a desired processing pressure in the chamber 10. The pumping annulus 44 is coupled to the interior of the chamber 10 through an annular gap 46 between the periphery of the wafer pedestal 18 and the chamber side wall 14. In order for the pump 40 to perform efficiently, the gap 46 is preferably free of obstructions.

A conventional slit valve opening 50 of the type wellknown in the art having a long thin opening in the chamber side wall 14 provides ingress and egress for a semiconductor wafer 52 to be placed upon and withdrawn from the wafer pedestal 18.

The walls 12, 14 confining the plasma within the chamber 10 are subject to attack from plasma ions and charged radicals, typically, for example, by ion bombardment. Such attack can consume the material in the walls 12, 14 or introduce incompatible material from the chamber walls 12, 14 into the plasma process carried out on the wafer 52, thereby contaminating the process. Such incompatible material may be either the material of the chamber wall itself or may be material (e.g., polymer) previously deposited on the chamber walls during plasma processing, which can flake off or be sputtered off. Plasma reaching the chamber walls can cause polymer deposition thereon.

The openings from the interior portion of the chamber 10, including the pedestal-to-side wall gap 46 and the slit valve opening 50, permit the plasma to leak or flow from the chamber 10. Such leakage can reduce plasma density near the openings 46, 50, thereby upsetting the plasma process carried out on the wafer 52. Also, such leakage can permit the plasma to attack surfaces outside of the chamber interior. The flow of plasma into the pumping annulus 44 through the gap 46 permits the plasma to attack the interior surfaces or walls of the pumping annulus 44. Thus, the designer must typically take into account not only the materials forming the chamber ceiling 12 and side wall 14, but in addition must also take into account the materials forming the pumping annulus, including the lower portion 56 of the side wall 14, the floor 16 and the bottom peripheral surface 58 of the wafer pedestal 18, which complicates the design. Such a loss of plasma from the chamber 10 also reduces plasma density or requires more plasma source power to maintain a desired plasma density over the wafer 52.

Magnetic Confinement

Figure 2:
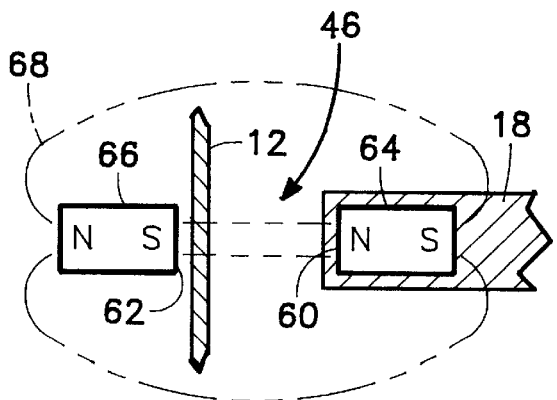
FIG. 2 is an enlarged view of the magnetic confinement apparatus near the pedestal-to-side wall gap.

In order to prevent plasma from flowing from the chamber 10 into the pumping annulus, a magnetic field perpendicular to the plane of the gap 46 and perpendicular to the direction of gas flow through the gap 46 is provided across the gap 46. This is preferably accomplished by providing an opposing pair of magnetic poles 60, 62 juxtaposed in facing relationship across the gap 46. In the embodiment according to FIG. 2, the magnetic pole 60 is the north pole of a magnet 64 located at the periphery of the wafer pedestal 18 while the magnetic pole 62 is the south pole of a magnet 66 next to the inner surface of the side wall 14. The embodiment of FIG. 2 may be regarded as an open magnetic circuit because the returning magnetic field lines of flux 68 in FIG. 2 radiate outwardly as shown in the drawing.

Figure 3:
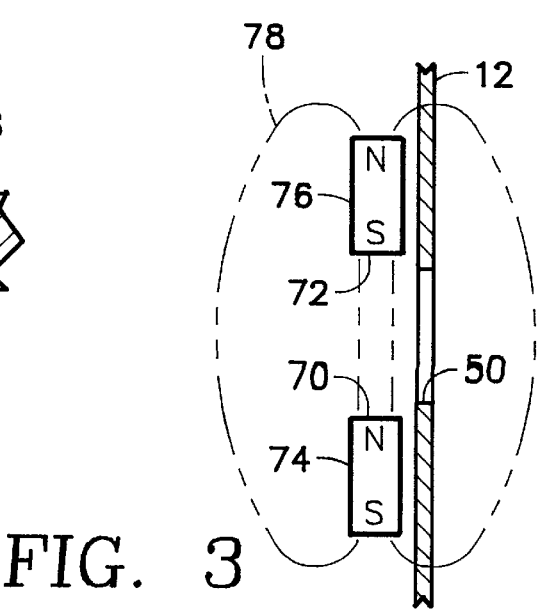
FIG. 3 is an enlarged view of the magnetic confinement apparatus near the wafer slit valve.

In order to prevent plasma from flowing from the chamber 10 through the slit valve opening 50, a magnetic field perpendicular to the plane of the slit valve opening 50 and perpendicular to the direction of gas flow through the slit valve opening 50 is provided across the slit valve opening 50. This is preferably accomplished by providing an opposing pair of magnetic poles 70, 72 juxtaposed in facing relationship across the slit valve opening 50. In the embodiment according to FIG. 3, the magnetic pole 70 is the north pole of a magnet 74 extending across the bottom edge of the slit valve opening 50 while the magnetic pole 72 is the south pole of a magnet 76 extending along the top edge of the slit valve opening 50. The embodiment of FIG. 3 may also be regarded as an open magnetic circuit because the returning magnetic field lines of flux 78 in FIG. 3 radiate outwardly as shown in the drawing.

One potential problem with the returning lines of magnetic flux 68 (FIG. 2) and 78 (FIG. 3) is that some returning flux lines extend near the wafer 52 and may therefore distort or perturb plasma processing of the wafer 52. In order to minimize or eliminate such a problem, a closed magnetic circuit (one in which returning magnetic lines of flux do not extend into the chamber) is employed to provide the opposing magnetic pole pairs 60, 62 and 70, 72. For example, in the embodiment of FIGS. 4 and 5, the opposing magnetic poles 60, 62 across the gap 44 are each a pole of a respective horseshoe ring magnet 80, 82 concentric with the wafer pedestal 18. The horseshoe ring magnet 80 has the north pole 60 and a south pole 81 while the horseshoe ring magnet has the south pole 62 and a north pole 83. The poles 60, 81 of the inner horseshoe ring magnet 80 are annuli connected at their inner radii by a magnetic cylindrical core annulus 85. Similarly, the poles 62, 83 of the outer horseshoe ring magnet 82 are annuli connected at their outer radii by a magnetic cylindrical core annulus 86. The magnetic circuit consisting of the inner and outer horseshoe ring magnets 80, 82 is a closed circuit because the lines of magnetic flux between the opposing pole pairs 60, 62 and 81, 83 extend straight between the poles and, generally, do not curve outwardly, at least not to the extent of the outwardly curving returning lines of flux 68, 78 of FIGS. 2 and 3.

Figure 4A:
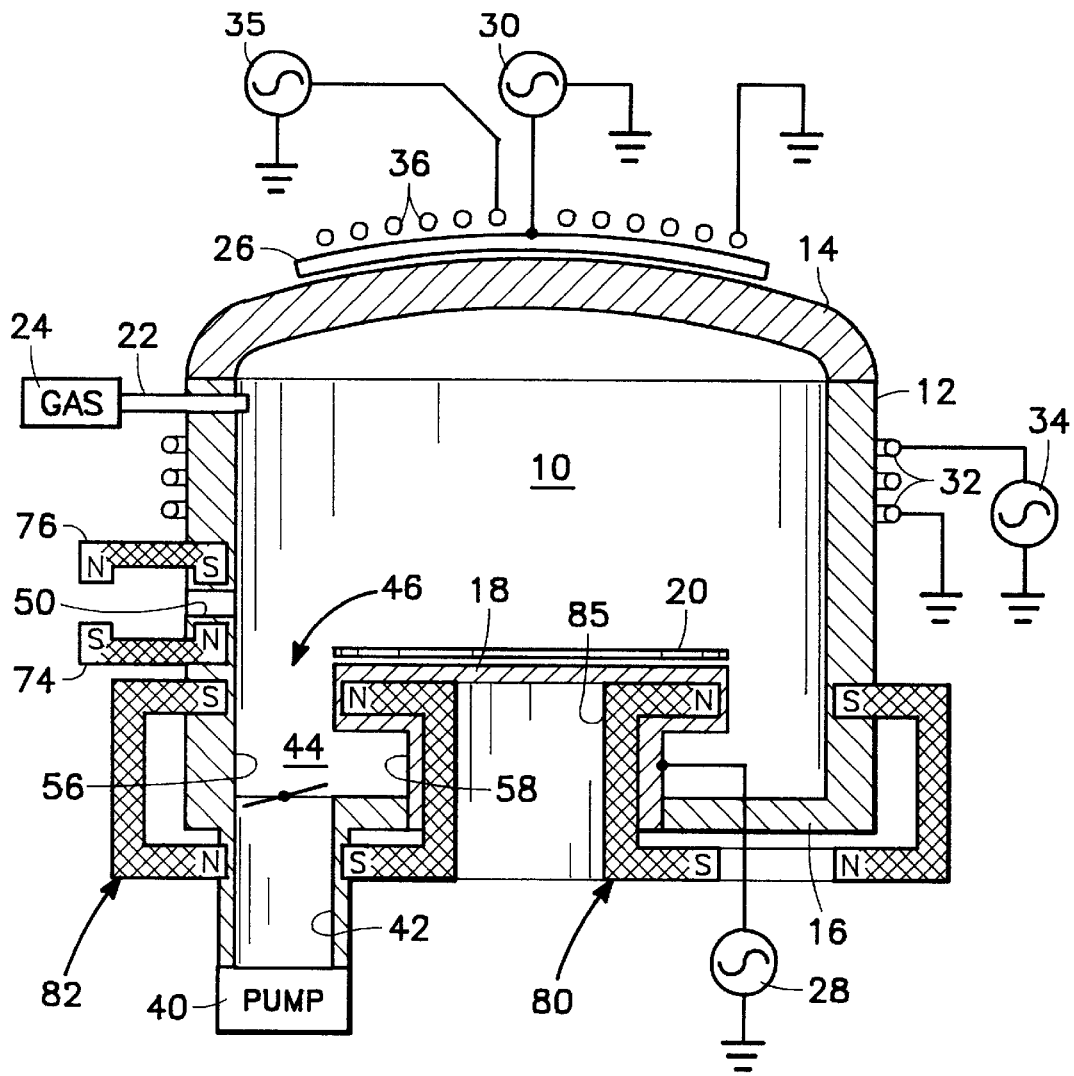
FIGS. 4A and 4B correspond to a side view of a plasma reactor in accordance with a preferred embodiment of the invention employing closed magnetic circuits having pairs of opposed magnets.
Figure 4B:
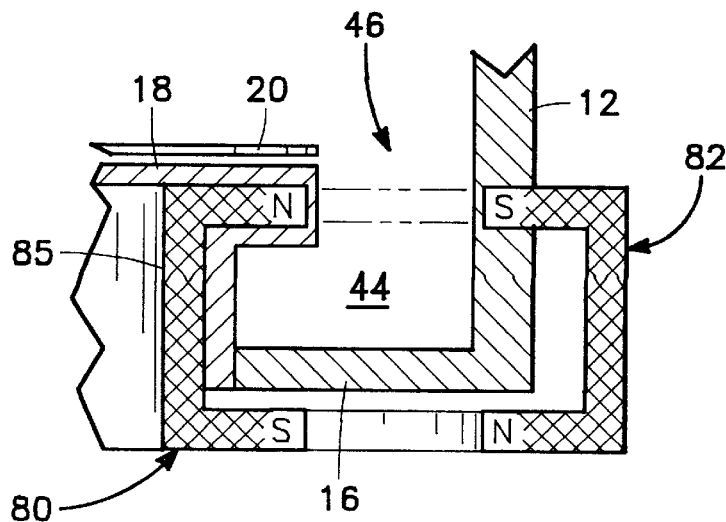
Figure 5:
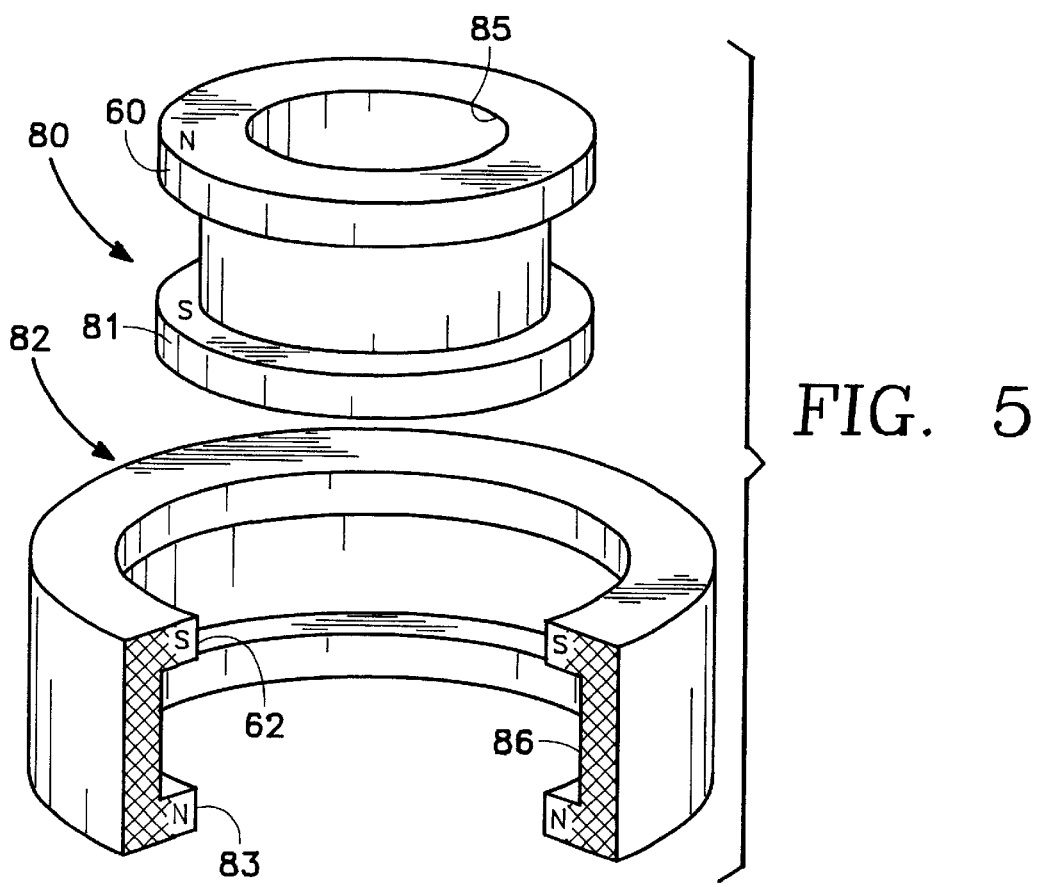
FIG. 5 is a perspective view of a pair of opposing ring magnets juxtaposed across the pedestal-to-side wall gap.
Figure 6:
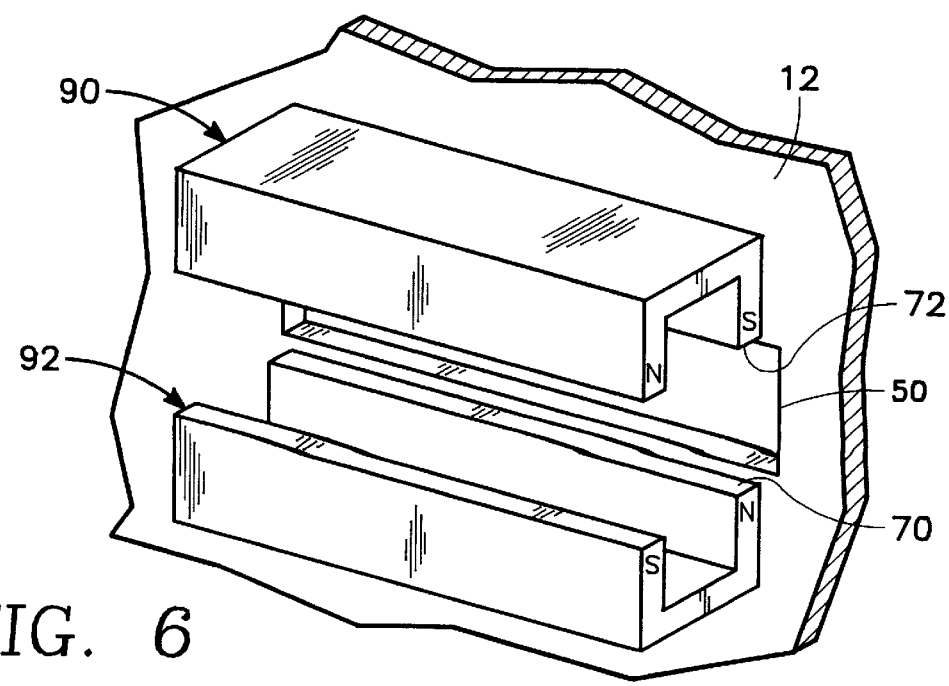
FIG. 6 is a perspective view of a pair of opposing magnets juxtaposed across the wafer slit valve.

In the embodiment of FIGS. 4A, 4B and 6, the opposing magnetic poles 70, 72 across the slit valve opening 50 are each a pole of a respective long horseshoe magnet 90, 92 extending along the length of the slit valve opening 50. the long horseshoe magnet 90 extends along the top boundary of the slit valve opening 50 while the other horseshoe magnet extends along bottom edge of the slit valve opening 50.

The advantage of the closed magnetic circuit embodiment of FIG. 4 is that the magnetic field confining the plasma does not tend to interfere with plasma processing on the wafer surface.

Figure 7:
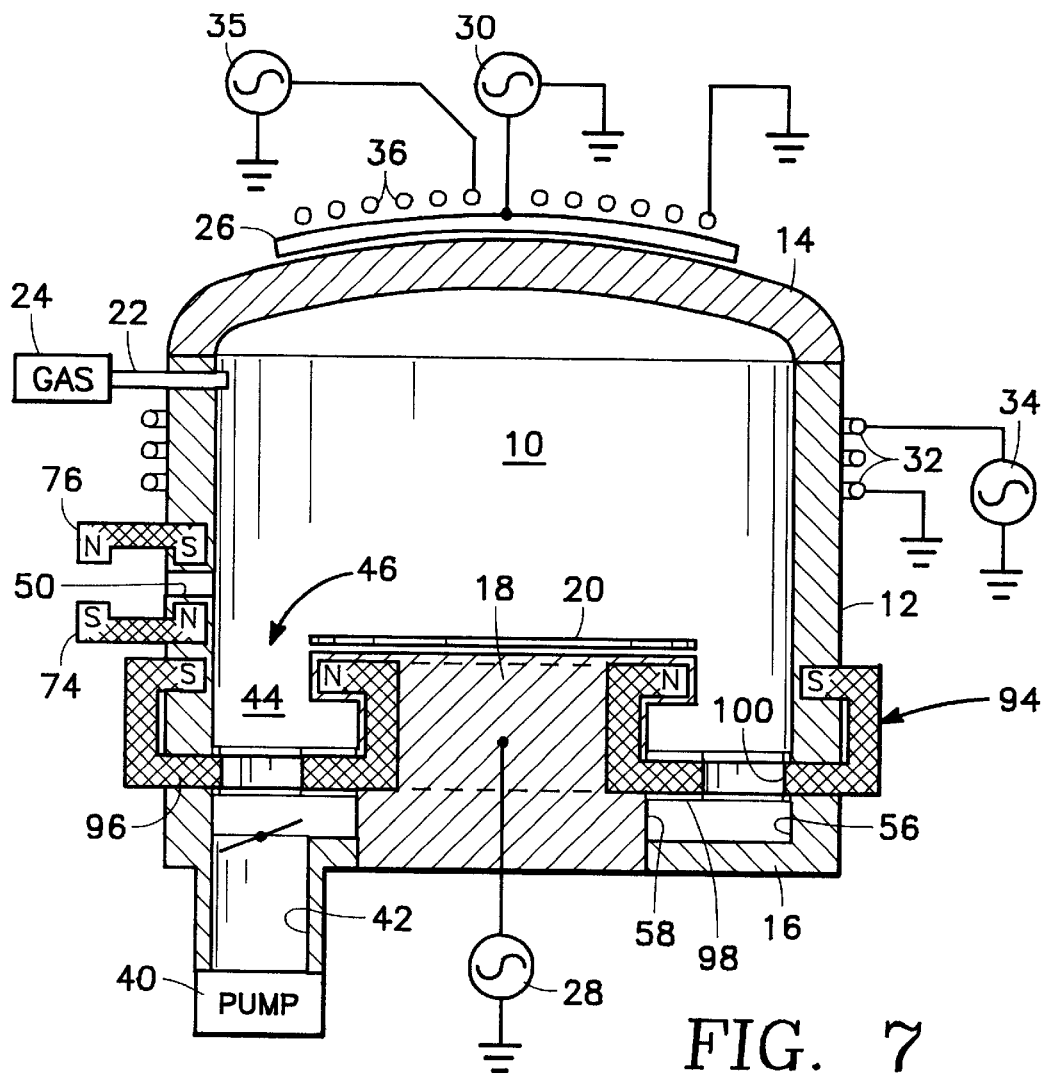
FIG. 7 is a cut-away side view of a plasma reactor in which the closed magnetic circuit is a single magnet whose opposing poles are juxtaposed across the pedestal-to-side wall gap and which are joined by a core extending across the pumping annulus.
Figure 8:
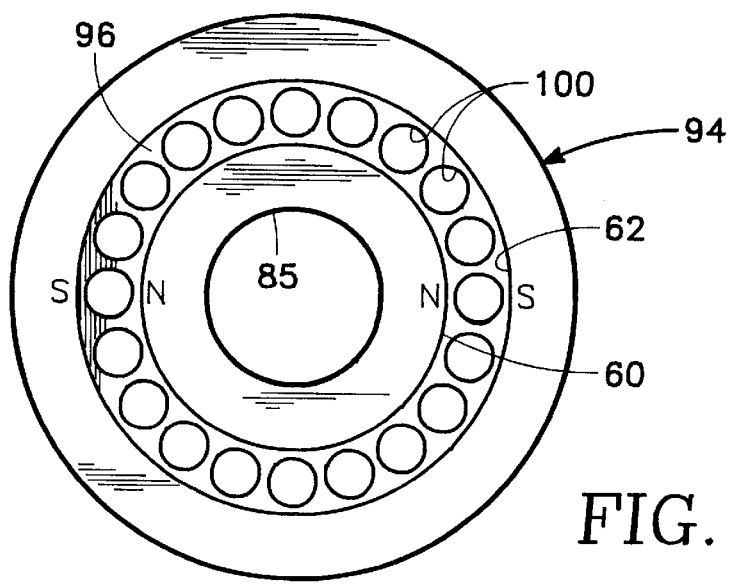
FIG. 8 is a top view of the single magnet of FIG. 7 and showing the gas flow holes through the core joining the opposite poles of the magnet.

In the embodiment of FIGS. 7 and 8, the lower annuli 81, 83 of the two horseshoe ring magnets 80, 82 are joined together as a single annulus by a magnetic core annulus 96, so that the horseshoe ring magnets 80, 82 constitute a single horseshoe ring magnet 94 having a north pole 60 and a south pole 62. The core annulus 96 extends across the pumping annulus 44 and can be protected by a protective coating 98 such as silicon nitride. In order to allow gas to pass through the pumping annulus 44, the core annulus 96 has plural holes 100 extending therethrough.

One advantage of the invention is that plasma ions are excluded from the pumping annulus 44. This is advantageous because the pumping annulus interior surfaces can be formed of any convenient material without regard to its susceptibility to attack by plasma ions or compatibility of its sputter by-products with the plasma process carried out on the wafer. This also eliminates reduction in plasma density due to loss of plasma ions through the pumping annulus. Another advantage is that gas flow through the pedestal-to-side wall gap 46 is not obstructed even though plasma is confined to the interior chamber 10 over the wafer. Furthermore, by so confining the plasma to a smaller volume (i.e., in the portion of the chamber 10 directly overlying the wafer 52), the plasma density over the wafer 52 is enhanced. A further advantage is that stopping plasma ions from exiting through the slit valve opening 50 eliminates loss of plasma density over portions of the wafer 52 adjacent the slit valve opening 50.

In one example, each of the magnetic pole pair 60, 62 has a strength of 20 Gauss for a distance across the gap 46 of 5 cm, while each of the magnetic pole pair 70, 72 has a strength of 20 Gauss for a width of the slit valve opening 50 of 2 cm.

While the invention has been described with reference to preferred embodiments in which the plasma confining magnets are protected from attack from plasma ions and processing gases by being at least partially encapsulated in the chamber walls or within the wafer pedestal or within a protective layer, in some embodiments (as for example, the embodiment of FIG. 6) the magnets may be protected by being located entirely outside of the chamber walls. Alternatively, if the reactor designer is willing to permit some plasma interaction with the magnets, magnets may be located inside the chamber in direct contact with the plasma, although this would not be preferred.

While the invention has been described in detail by specific reference to preferred embodiments, it is understood that variations and modifications thereof may be made without departing from the true spirit and scope of the invention.

What is claimed is:

1. A plasma reactor comprising:
   a chamber enclosure having a process gas inlet and including a ceiling, a sidewall and a workpiece support pedestal capable of supporting a workpiece at a plasma processing location facing the ceiling, said workpiece processing location and ceiling defining a process region therebetween, said pedestal being spaced from said sidewall to define a pumping annulus therebetween having inner and outer walls, to permit process gas to be evacuated therethrough from the process region;
   a pair of opposing plasma confinement magnetic poles arranged adjacent said annulus within one of said inner and outer walls of said annulus, the opposing magnetic poles being axially displaced from one another said opposite poles being oriented to provide maximum magnetic flux in a direction across said annulus and a magnetic flux at said processing location less than the magnetic flux across said annulus.

2. The reactor of claim 1 further comprising a connector of magnetically permeable material within said one wall connecting said opposing wall.

3. The reactor of claim 1 wherein said pair of poles comprise a horseshoe magnet.

4. The reactor of claim 2 wherein said magnetic poles are ring shaped and are concentric with said annulus.

5. The reactor of claim 4 wherein said connector is ring shaped and concentric with said annulus.

6. The reactor of claim 1 wherein said magnetic poles are within said inner wall.

7. The reactor of claim 1 wherein said magnetic poles are within said outer wall.

8. The reactor of claim 3, in which said horseshoe magnet is ring-shaped and concentric with said annulus.

9. The reactor of claim 8, in which said horseshoe magnet is within one of said inner and outer walls.

10. The reactor of claim 1 in which the opposite poles are connected by a magnetically permeable connector.

11. The reactor of claim 1 which further includes a horseshoe magnet arrangement having a pair of legs respectively terminating in said opposite poles, with at least one ring magnet comprising one leg of the horseshoe arrangement, and with the remainder of the arrangement being of magnetically permeable material.

12. A plasma reactor comprising:
   a chamber having a process gas inlet and enclosing a plasma process region;
   a workpiece support pedestal within said chamber and capable of supporting a workpiece at a processing location open to said plasma process region, said support pedestal and chamber defining an annulus therebetween having opposed walls to permit gas to be evacuated therethrough from said process region;
   a ring-shaped horseshoe magnet positioned adjacent and about said annulus within one of said inner and outer walls of said annulus, the horseshoe magnet being oriented to direct its maximum magnetic flux across said annulus and a reduced magnetic flux elsewhere.

13. The reactor of claim 1 wherein said horseshoe magnet is within a radially inner one of said opposed walls.

14. The reactor of claim 1 wherein said horseshoe magnet is within a radially outer one of said opposed walls.

* * * * *